(12) United States Patent
Chakraborty et al.

(10) Patent No.: US 12,191,139 B2
(45) Date of Patent: Jan. 7, 2025

(54) SELECTIVE MOLECULAR LAYER DEPOSITION OF ORGANIC AND HYBRID ORGANIC-INORGANIC LAYERS

(71) Applicant: Applied Materials, Inc., Santa Clara, CA (US)

(72) Inventors: Tapash Chakraborty, Maharashtra (IN); Robert Jan Visser, Menlo Park, CA (US); Prerna Goradia, Mumbai (IN)

(73) Assignee: Applied Materials, Inc., Santa Clara, CA (US)

( * ) Notice: Subject to any disclaimer, the term of this patent is extended or adjusted under 35 U.S.C. 154(b) by 252 days.

(21) Appl. No.: 17/563,024

(22) Filed: Dec. 27, 2021

(65) Prior Publication Data

US 2022/0130663 A1 Apr. 28, 2022

Related U.S. Application Data

(62) Division of application No. 15/986,178, filed on May 22, 2018, now abandoned.

(Continued)

(51) Int. Cl.
*H01L 21/02* (2006.01)
*C23C 16/455* (2006.01)
(Continued)

(52) U.S. Cl.
CPC .. *H01L 21/02118* (2013.01); *C23C 16/45553* (2013.01); *H01L 21/0228* (2013.01);
(Continued)

(58) Field of Classification Search
CPC ........... H01L 21/02118; H01L 21/0228; H01L 21/02304; H01L 21/02312; H01L 21/3105; C23C 16/45553; B05D 1/36; B05D 1/60
See application file for complete search history.

(56) References Cited

U.S. PATENT DOCUMENTS

2006/0183322 A1 8/2006 Sandhu et al.
2008/0199977 A1* 8/2008 Weigel ................ H01L 21/3105
257/E21.24

(Continued)

FOREIGN PATENT DOCUMENTS

EP 2818474 A1 12/2014
JP 2010012769 A 1/2010

(Continued)

OTHER PUBLICATIONS

Machine Translation of JP2010012769A, 15 pages.
(Continued)

*Primary Examiner* — Sue A Purvis
*Assistant Examiner* — Sun Mi Kim King
(74) *Attorney, Agent, or Firm* — Servilla Whitney LLC (57) ABSTRACT

Embodiments of the disclosure relate to methods of selectively depositing organic and hybrid organic/inorganic layers. More particularly, embodiments of the disclosure are directed to methods of modifying hydroxyl terminated surfaces for selective deposition of molecular layer organic and hybrid organic/inorganic films. Additional embodiments of the disclosure relate to cyclic compounds for use in molecular layer deposition processes.

8 Claims, 6 Drawing Sheets

Related U.S. Application Data (60) Provisional application No. 62/547,436, filed on Aug. 18, 2017, provisional application No. 62/512,067, filed on May 28, 2017.

(51) Int. Cl.
  *H01L 21/3105* (2006.01)
  *B05D 1/00* (2006.01)
  *B05D 1/36* (2006.01)

(52) U.S. Cl.
  CPC .. *H01L 21/02304* (2013.01); *H01L 21/02312* (2013.01); *H01L 21/3105* (2013.01); *B05D 1/36* (2013.01); *B05D 1/60* (2013.01)

(56) References Cited

U.S. PATENT DOCUMENTS

| | | | |
|---|---|---|---|
| 2010/0123097 A1 | 5/2010 | Belfadhel et al. | |
| 2012/0121932 A1 | 5/2012 | George et al. | |
| 2013/0330482 A1 | 12/2013 | Leu et al. | |
| 2014/0231968 A1* | 8/2014 | Gronheid | G03F 7/091 257/632 |
| 2015/0021774 A1 | 1/2015 | Chiang et al. | |
| 2016/0244581 A1 | 8/2016 | Brink et al. | |
| 2016/0322213 A1 | 11/2016 | Thompson et al. | |

FOREIGN PATENT DOCUMENTS

| | | | | |
|---|---|---|---|---|
| WO | 2006097525 A2 | 9/2006 | | |
| WO | WO-2010019125 A1 * | 2/2010 | | C09B 69/008 |

OTHER PUBLICATIONS

PCT International Search Report and Written Opinion in PCT/US2018/033894 dated Sep. 21, 2018, 12 pages.

George, Steven M., et al., "Surface Chemistry for Molecular Layer Deposition of Organic and Hybrid Organic-Inorganic Polymers", Accounts of Chemical Research, vol. 42, No. 4, Apr. 2009, pp. 498-508.

Haensch, Claudia, et al., "Chemical modification of self-assembled silane based monolayers by surface reactions", Chem. Soc. Rev., 2010, 39, pp. 2323-2334.

Jiang, Ying-Bing, et al., "Sub-10 nm Thick Microporous Membranes Made by Plasma-Defined Atomic Layer Deposition of a Bridged Silsesquioxane Precursor", J. Am. Chem. Soc. 2007, 129, 15446-15447.

Ju, Ling, et al., "Cyclic azasilanes as volatile and reactive precursors for atomic layer deposition of silicon dioxide", J. Mater. Chem. C, 2016, 4, 4034-4039.

Ju, Ling, et al., "Molecular layer deposition using cyclic azasilanes, maleic anhydride, trimethylaluminum, and water", J. Vac. Sci. Technol. A 35(1), Jan./Feb. 2017, 9 pages.

Maddox, Annalese F., et al., "Single Molecular Layer Adaption of Interfacial Surfaces by Cyclic Azasilane "Click-Chemistry"", Mater. Res. Soc. Symp. Proc. vol. 1793, 2015 Materials Research Society, 7 pages.

Sundberg, Pia, et al., "Organic and inorganic-organic thin film structures by molecular layer deposition: A review", Beilstein J. Nanotechnol. 2014, 5, 1104-1136.

Van Bui, H., et al., "Atomic and molecular layer deposition: off the beaten track", Chem. Commun., 2017, 53, 45-71.

\* cited by examiner

SELECTIVE MOLECULAR LAYER DEPOSITION OF ORGANIC AND HYBRID ORGANIC-INORGANIC LAYERS

CROSS-REFERENCE TO RELATED APPLICATIONS

This application is a divisional of United Stated patent application Ser. No. 15/986,178, filed May 22, 2018, which claims priority to U.S. Provisional Application No. 62/512,067, filed May 28, 2017, and U.S. Provisional Application No. 62/547,436, filed Aug. 18, 2017, the entire disclosures of which are hereby incorporated by reference herein.

FIELD

Embodiments of the disclosure relate to methods for selectively depositing organic and hybrid organic/inorganic layers. More particularly, embodiments of the disclosure are directed to methods of modifying hydroxyl terminated surfaces for selective deposition of molecular layer organic and hybrid organic/inorganic films. Additional embodiments of the disclosure relate to cyclic compounds for use in molecular layer deposition processes.

BACKGROUND

The semiconductor industry is primarily based on principles of inorganic chemistry. For the most part, innovation in the field centers around new metal deposition techniques, novel ligands for varied physical properties of metal complexes and equipment and processes which seek to make semiconductors more effective, more finely patterned and easier to produce.

One area of semiconductor fabrication often left unexplored is the field of carbon-based films. These films often comprise other common hetero atoms as well, including nitrogen, oxygen, and sulfur. They can prove useful in semiconductor patterning, CD shrinks and patternable semiconductor spacers.

The production and deposition of carbon films can be performed by molecular layer deposition (MLD). It is carried out through the exposure of a substrate to a series of reactive precursors, such that the process produces a series of sequential self-limiting, surface reactions. Each precursor is introduced to the processing chamber, allowed to completely react with the substrate surface, and then purged, before the next precursor is introduced. In this regard, MLD is similar to atomic layer deposition (ALD).

The films produced in an MLD process are typically polymeric, containing the same repeating molecular units which remain attached to the substrate after each precursor cycle.

Typically, the precursors utilized in MLD have at least two functional moieties. In some embodiments, these moieties are the same (e.g. both amines or both acyl halides). For example, a precursor with two acyl chloride groups could be used with a precursor with two amino groups to form a polyamide. In this example, the acyl chloride precursor could react with an amino terminated surface. The unreacted acyl chloride moiety is available to react with one of the amino moieties. The unreacted amino moiety is available to react with an acyl chloride moiety. The cycle can continue until a predetermined chain length is produced.

In these embodiments, care must be taken so that a given precursor only reacts once with the substrate surface. If both functional moieties of a precursor were to react with the surface, the film could not be grown any thicker since there is no longer an available moiety to react. As such, the materials deposited form long chains of organic material attached to the substrate. When placed in close proximity on the substrate surface these chains form an organic film. These precursors can also comprise inorganic atoms or metal organic variants in place of atoms as well (e.g. trimethyl aluminum can be used to produce alucones). In this circumstance, the film produced would be a hybrid organic/inorganic film.

Therefore, there is an ongoing need in the art for precursors and processes for molecular layer deposition that provide control over the film growth.

SUMMARY

One or more embodiments of the disclosure are directed to a method of depositing a film, the method comprised of providing a substrate comprising a first material having a hydrogen terminated surface and a second material having a hydroxyl terminated surface, exposing the substrate to a modifying compound comprising an modifying species that reacts with the hydroxyl terminated surface of the second material to form a modified second surface on the second material, and exposing the substrate to one or more deposition gases which react with the modified second surface of the second material to form a film on the second material; where the modifying species has a general formula (RO)$_3$Si-L-Si(OR)$_3$ where each R is independently selected from C1-C4 alkyl groups and L is an aromatic moiety or a carbon chain comprising 1 to 3 carbon atoms.

Additional embodiments of the disclosure are directed to a molecular layer deposition method comprising exposing a substrate surface to a first deposition gas comprising compounds with a general structure of:

where a ring of the first deposition gas opens, the first deposition gas adsorbs to the substrate surface, L is a linking group comprising at least 1 carbon atoms, and the first deposition gas adsorbs to (i.e. reacts with) the substrate surface and exposing the first deposition gas on the substrate surface to at least a second deposition gas to form a molecular layer on the substrate surface.

Further embodiments of the disclosure are directed to a molecular layer deposition method comprising exposing a substrate surface to a first deposition gas comprising one or more of where a ring of the first deposition gas opens and the first deposition gas adsorbs to (i.e. reacts with) the substrate surface and exposing the first deposition gas on the substrate surface to at least a second deposition gas to form a molecular layer on the substrate surface.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of the disclosure and are therefore not to be considered limiting of its scope, for the disclosure may admit to other equally effective embodiments.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Embodiments of the disclosure provide methods for selectively depositing molecular layers comprised of organic or hybrid organic/inorganic layers. The process of various embodiments uses molecular layer deposition techniques similar to atomic layer deposition (ALD) to provide molecular layers on a substrate.

A "substrate surface", as used herein, refers to any portion of a substrate or portion of a material surface formed on a substrate upon which film processing is performed. For example, a substrate surface on which processing can be performed include materials such as silicon, silicon oxide, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. Substrates may have various dimensions, such as 200 mm or 300 mm diameter wafers, as well as, rectangular or square panes. In some embodiments, the substrate comprises a rigid discrete material.

"Atomic layer deposition" as used herein refers to the sequential exposure to a substrate of two or more deposition gases to deposit a layer of material on a substrate surface. As used in this specification and the appended claims, the terms "reactive compound", "reactive gas", "reactive species", "precursor", "process gas", "deposition gas", and the like are used interchangeably to mean a substance with a species capable of reacting with the substrate surface or material on the substrate surface in a chemical reaction (e.g., substitution, elimination, addition, oxidation, reduction). The substrate, or portion of the substrate, is exposed sequentially to the two or more reactive compounds which are introduced into a reaction zone of a processing chamber. In a time-domain process, exposure to each reactive compound is separated by a time delay to allow each compound to react with the substrate surface and then be purged from the processing chamber. In a spatial process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In a time-domain ALD process, exposure to each reactive compound is separated by a time delay to allow each compound to adsorb and/or react on the substrate surface and then be purged from the processing chamber. The reactive gases are prevented from mixing by the purging of the processing chamber between subsequent exposures.

In a spatial ALD process, the reactive gases are flowed into different processing regions within a processing chamber. The different processing regions are separated from adjacent processing regions so that the reactive gases do not mix. The substrate can be moved between the processing regions to separately expose the substrate to the processing gases. During substrate movement, different portions of the substrate surface, or material on the substrate surface, are exposed to the two or more reactive compounds so that any given point on the substrate is substantially not exposed to more than one reactive compound simultaneously. As will be understood by those skilled in the art, there is a possibility that a small portion of the substrate may be exposed to multiple reactive gases simultaneously due to diffusion of the gases within the processing chamber, and that the simultaneous exposure is unintended, unless otherwise specified.

In one aspect of a time-domain process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired molecular layer or layer thickness is formed on the substrate surface. In either scenario, the process of pulsing compound A, purge gas, compound B and purge gas is a cycle. A cycle can start with either compound A or compound B and continue the respective order of the cycle until achieving a film with the predetermined thickness.

In an embodiment of a spatial process, a first reactive gas and second reactive gas are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas, although not simultaneously.

One or more embodiments of the disclosure use a variant of atomic layer deposition (ALD) called molecular layer deposition (MLD). MLD processes can be used to deposit organic and/or hybrid organic/inorganic polymers such as polyimide, polyamide, polyuria or polymers interspersed with metal atoms. For example, MLD of polyurea may be performed by alternating exposures of 1,4-diisocyanatobutane with various amines, such as ethylenediamine or tris (2-aminoethyl)amine. Reactive moieties such as isocyanato groups (see equation 1), aldehydes or ketones (see equation 2), acyl chlorides (see equation 3) and anhydrides (see equation 4) can participate in MLD reactions with various amines such as ethylenediamine.

Equations 1-4 show common organic reactions that occur between amines and isocyanates, ketones, acyl chlorides and anhydrides.

In some embodiments, the reactant is at least bifunctional so that one functionality can react with the substrate surface while the other functionality may remain unreacted to participate in a subsequent MLD half-reaction.

In some embodiments, one or more reactant comprises multiple functionalities which are different from one another. As used in this specification and the appended claims, these reactants may be described as heterobifunctional. For example, a heterobifunctional reactant may comprise both an amine functionality and a carboxylic acid functionality. In some embodiments, at least one reactant comprises 4-aminobenzoic acid or 4-aminobenzoyl chloride. In some embodiments, at least one reactant consists essentially of 4-aminobenzoic acid. In some embodiments, at least one reactant consists essentially of 4-aminobenzoyl chloride.

In some embodiments, one or more reactant comprises a protected functionality, which may be removed to expose a reactive functionality. In some embodiments, at least one reactant comprises methyl 4-aminobenzoate.

In some embodiments, the protected functionality may be removed through a chemical reaction with an additional reagent. In some embodiments, the protected functionality may be removed through the use of heat or radiation.

While those skilled in the art will recognize additional examples, one example of removal of a protected functionality may be described by the following process. A reactant comprising an imine group is exposed to a substrate and bonds to the substrate through a different reactive group. Subsequently, the imine group is reacted with water to expose an amine group.

Without being bound by theory, the use of heterobifunctional reactants and reactants with protected functionalities reduces the probability of a single reactant molecule unintentionally reacting simultaneously with multiple substrate surface sites.

One or more embodiments of the disclosure are directed to a method of depositing a film. The method comprises providing a substrate comprising a first material having a hydrogen terminated surface and a second material having a hydroxyl terminated surface. The substrate is exposed to a modifying compound which reacts with the hydroxyl terminated surface of the second material to form a modified surface. The substrate is then exposed to one or more deposition gases which react with the modified surface to form a film on the second material. The modifying compound comprises a modifying species with a general formula $X_3Si-L-CN$ where X is a halogen and L is an aromatic moiety or a carbon chain comprising 1 to 3 carbon atoms. In some embodiments, the modifying compound or modifying species includes one or more of an alkenyl or alkynyl group. Stated differently, in some embodiments the modifying compound or modifying species contains an unsaturated carbon-carbon bond.

In some embodiments, the first material comprises silicon and the second material comprises silicon oxide. In some embodiments, X consists essentially of chlorine.

As used in this specification and the appended claims, the term "consists essentially of" means that greater than or equal to about 95%, 98% or 99% of the specified group(s) is the stated substituent, based on the total number of relevant substituents.

In some embodiments, L consists essentially of an alkyl group with 3 carbons. In some embodiments, L consists essentially of —(CH$_2$)$_3$—. In some embodiments, L consists essentially of two methylene units (—(CH$_2$)$_2$—). In some embodiments, L consists essentially of one methylene unit. In some embodiments, L comprises more than one carbon atom and contains at least one double bond. In some embodiments, L consists essentially of —CH=CH—. In some embodiments, L consists essentially of —CH=CH—CH$_2$—. In some embodiments, L comprises more than one carbon atom and a triple bond.

In some embodiments, L consists essentially of a phenyl group. In some embodiments, the phenyl group is substituted in para-positions by the —SiX$_3$ group and the —CN group. Stated differently, in some embodiments, the halosilyl group (—SiX$_3$) and the cyano group (—CN) are connected to the phenyl group in a para configuration (i.e., opposite sides of the phenyl ring). In some embodiments, the phenyl group is substituted in meta-positions by the halosilyl and cyano groups.

In some embodiments, the modified surface is further exposed to an acid to form a carboxylic acid terminated surface prior to exposure to one or more deposition gases. In some embodiments, the acid to which the modified surface is exposed comprises one or more of HCl or HNO$_3$. In some embodiments, the acid consists essentially of HCl. In some embodiments, the acid consists essentially of HNO$_3$.

In some embodiments, the modified surface is further exposed to a reducing agent to form an amine terminated surface prior to exposure to one or more deposition gases. In some embodiments, the reducing agent to which the modified surface is exposed comprises hydrogen. In some embodiments, the reducing agent consists essentially of hydrogen.

Figure 7:
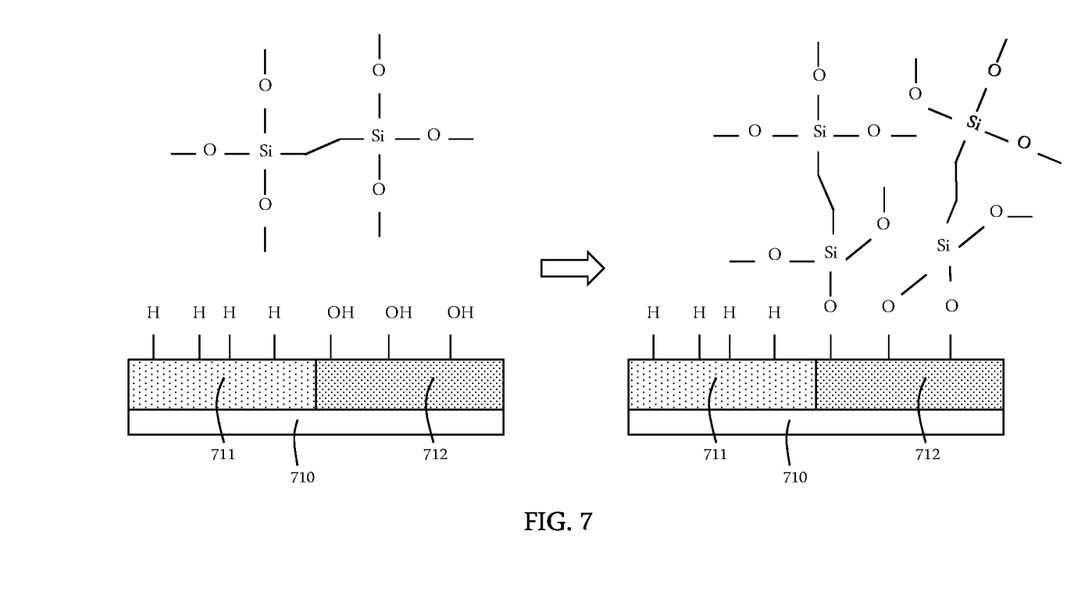
FIG. 7 illustrates an exemplary reaction scheme for the modification of a hydroxyl terminated surface using a modifying compound comprising a modifying species with a general formula $(CH_3O)_3Si$—$C_2H_4$—$Si(OCH_3)_3$ according to one embodiment described herein.

Referring to FIG. 7, some embodiments of the disclosure are directed to a method of depositing a film. The method comprises providing a substrate 710 comprising a first material 711 having a hydrogen terminated surface and a second material 712 having a hydroxyl terminated surface. The substrate 710, and therefore both the first material 711 and the second material 712, is exposed to a modifying compound comprising a modifying species that reacts with the hydroxyl terminated surface of the second material 712 to form a second modified surface on the second material 712. The substrate is exposed to one or more deposition gases, not shown, which react with the second modified surface of the second material 712 to form a film on the second material 712. The modifying species has a general formula (RO)$_3$Si-L-Si(OR)$_3$ where each R is independently selected from C1-C4 alkyl groups and L is an aromatic moiety or a carbon chain comprising 1 to 3 carbon atoms.

As used in this manner, the letter "C" followed by a numeral (e.g., "C4") means that the substituent comprises the specified number of carbon atoms (e.g., C4 comprises four carbon atoms). The alkyl groups can be straight chain groups (e.g. n-butyl), branched groups (e.g. t-butyl).

In some embodiments, the first material comprises silicon and the second material comprises silicon oxide. In some embodiments, R consists essentially of methyl. As used in this specification and the appended claims, the term "R consists essentially of" means that greater than or equal to about 95%, 98% or 99% of the R groups are the stated substituent, on a molar basis. In some embodiments, R consists essentially of methyl and ethyl groups. In some embodiments, R consists essentially of ethyl groups. In some embodiments, at least one R group is a methyl group. In some embodiments, at least one R group is an ethyl group. In some embodiments, at least one R group is a propyl group. In some embodiments, at least one R group is a butyl group (e.g., n-butyl, isobutyl, sec-butyl, t-butyl).

In some embodiments, L consists essentially of an alkyl group with 2 carbons. In some embodiments, L consists essentially of —(CH$_2$)$_2$—. In some embodiments, L consists essentially of three methylene units (—(CH$_2$)$_3$—). In some embodiments, L consist essentially of one methylene unit. In some embodiments, L comprises more than one carbon atom and contains at least one double bond. In some embodiments, L consists essentially of —CH=CH—. In some embodiments, L consists essentially of —CH=CH—CH$_2$—. In some embodiments, L comprises more than one carbon atom and a triple bond.

In some embodiments, L consists essentially of a phenyl group. In some embodiments, the phenyl group is substituted in para-positions by the —Si(R)$_3$ groups. Stated differently, in some embodiments, the alkoxysilane groups (—Si(OR)$_3$) are connected to the phenyl group in a para configuration (i.e., opposite sides of the phenyl ring). In some embodiments, the phenyl group is substituted in meta-positions by the alkoxysilane groups.

In some embodiments, the second modified surface is exposed to one or more deposition gases which react with the second modified surface to form a film on the second material. The deposition gases used may comprise any suitable deposition reactants. In some embodiments, the deposition reactants are selected to form an organic polymer film on the second material of the substrate. In some embodiments, the deposition reactants are selected to form a hybrid organic/inorganic polymer film on the second material of the substrate.

In some embodiments, the deposition reactants are selected to form a metal-containing film on the second material of the substrate. In some embodiments, the metal containing film may comprise metal, metal nitrides, metal carbides, metal oxides, or metal alloys.

In some embodiments, the deposition reactants comprise the modifying species. In some embodiments, the deposition reactants do not comprise the modifying compound or modifying species. In some embodiments, the substrate is exposed to the modifying compound only before exposure to the deposition reactants.

In some embodiments, the film deposited on the substrate comprises a bottom monolayer of the modifying species.

One or more embodiments of the disclosure are directed to a molecular layer deposition method comprising exposing a substrate surface to a first deposition gas comprising one or more compounds with a general structure of:

where a ring of the first deposition gas opens and the first deposition gas adsorbs to the substrate surface, L is a linking group comprising at least 1 carbon atoms, and exposing the first deposition gas on the substrate surface to a second deposition gas to form a molecular layer on the substrate surface.

The linking group can have a backbone and substituents. The backbone of the linking group is the shortest chain of atoms connecting the carbonate oxygen atoms. The substituents are atoms or groups of atoms, other than hydrogen, that connect to the backbone. In some embodiments, the linking group contains a total of 1, 2, 3, 4, 5, 6, 7, 8, 9, 10, 11 or 12 carbon atoms. In some embodiments, the backbone of the linking group has 1, 2, 3, 4, 5, 6 or 7 atoms. In some embodiments, the linking group consists essentially of carbon atoms and hydrogen atoms. In some embodiments, the backbone of the linking group consists essentially of carbon atoms and hydrogen atoms. In some embodiments, the linking group is substituted with one or more C1-C6 alkyl group or aryl group. In some embodiments, the linking group comprises a total of 3 carbon atoms. In some embodiments, the linking group is substituted with one or more halogen atom. In some embodiments, the linking group includes one or more carbonyl group. In some embodiments, the linking group comprises at least one double bond.

In some embodiments, the first deposition gas consists essentially of a compound according to Formula I:

(I)

In some embodiments, the first deposition gas consists essentially of a compound according to Formula II:

(II)

One or more embodiments of the disclosure are directed to a molecular layer deposition method comprising exposing a substrate surface to a first deposition gas comprising one or more of:

where a ring of the first deposition gas opens and the first deposition gas reacts with the substrate surface, and exposing the first deposition gas on the substrate surface to a second deposition gas to form a molecular layer on the substrate surface.

In some embodiments, the first deposition gas consists essentially of a compound according to Formula III:

(III)

In some embodiments, the first deposition gas consists essentially of a compound according to Formula IV:

(IV)

Without being bound by theory or the mechanism of scheme (V), the ring opening process of the first deposition gas may be exemplified in reaction with an amine terminated surface as follows:

(V)

Without being bound by theory, the use of ring opening reactions in MLD processes reduces the probability of a single reactant molecule reacting simultaneously with multiple substrate surface sites.

One or more embodiments of the disclosure are directed to a molecular layer deposition method to deposit a hybrid organic/inorganic layer. The method comprises exposing a substrate surface to a first deposition gas comprising an inorganic precursor.

As used in this specification and the appended claims, an "inorganic precursor" is any MLD reactant which comprises atoms other than non-metals. Stated differently, an inorganic precursor comprises at least one atom of a metal or metalloid. In some embodiments, the inorganic precursor comprises a transition metal. In some embodiments, the inorganic precursor comprises a post-transition metal. In some embodiments, the inorganic precursor comprises one or more of aluminum, zinc, titanium, silicon, iron, nickel, cobalt or chromium.

In some embodiments, the first deposition gas comprises one or more of trimethyl aluminum (TMA), diethyl zinc (DEZ), tetrakis(dimethylamido) titanium (TDMAT), tetrakis (dimethylamido) silicon (TDMAS), or bis(cyclopentadienyl) M (II), where M is iron, nickel, cobalt, or chromium. In some embodiments, various organic precursors can be used including, but not limited to, ethylene diamine, ethanolamine, and cyclic organic precursors.

Figure 1:
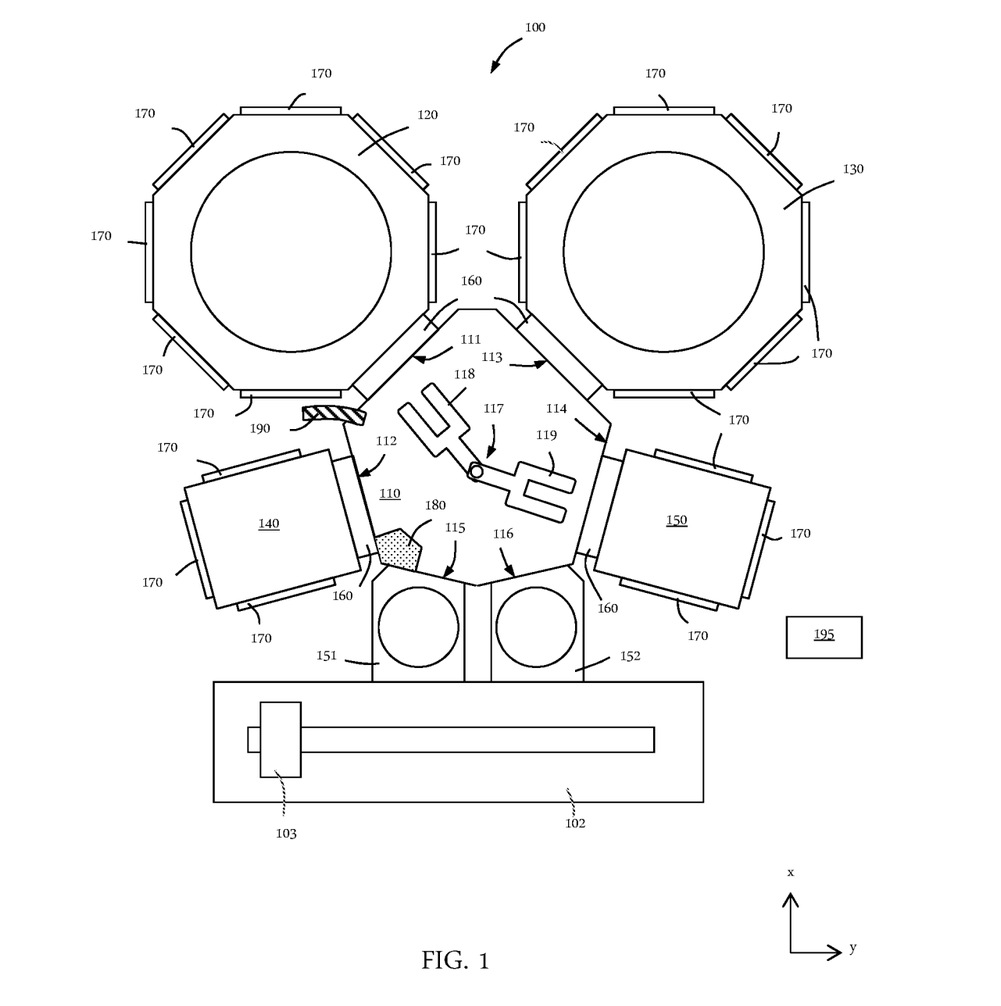
FIG. 1 shows a schematic view of a processing platform in accordance with one or more embodiment of the disclosure.

Referring to the Figures, FIG. 1 shows a processing platform 100 in accordance with one or more embodiment of the disclosure. The embodiment shown in FIG. 1 is merely representative of one possible configuration and should not be taken as limiting the scope of the disclosure. For example, in some embodiments, the processing platform 100 has different numbers of process chambers, buffer chambers and robot configurations.

The processing platform 100 includes a central transfer station 110 which has a plurality of sides 111, 112, 113, 114, 115, 116. The transfer station 110 shown has a first side 111, a second side 112, a third side 113, a fourth side 114, a fifth side 115 and a sixth side 116. Although six sides are shown, those skilled in the art will understand that there can be any suitable number of sides to the transfer station 110 depending on, for example, the overall configuration of the processing platform 100.

The transfer station 110 has a robot 117 positioned therein. The robot 117 can be any suitable robot capable of moving a wafer during processing. In some embodiments, the robot 117 has a first arm 118 and a second arm 119. The first arm 118 and second arm 119 can be moved independently of the other arm. The first arm 118 and second arm 119 can move in the x-y plane and/or along the z-axis. In some embodiments, the robot 117 includes a third arm or a fourth arm (not shown). Each of the arms can move independently of other arms.

A batch processing chamber 120 can be connected to a first side 111 of the central transfer station 110. The batch processing chamber 120 can be configured to process x wafers at a time for a batch time. In some embodiments, the batch processing chamber 120 can be configured to process in the range of about four (x=4) to about 12 (x=12) wafers at the same time. In some embodiments, the batch processing chamber 120 is configured to process six (x=6) wafers at the same time. As will be understood by the skilled artisan, while the batch processing chamber 120 can process multiple wafers between loading/unloading of an individual wafer, each wafer may be subjected to different process conditions at any given time. For example, a spatial atomic layer deposition chamber, like that shown in FIGS. 2 through 6, expose the wafers to different process conditions in different processing regions so that as a wafer is moved through each of the regions, the process is completed.

Figure 2:
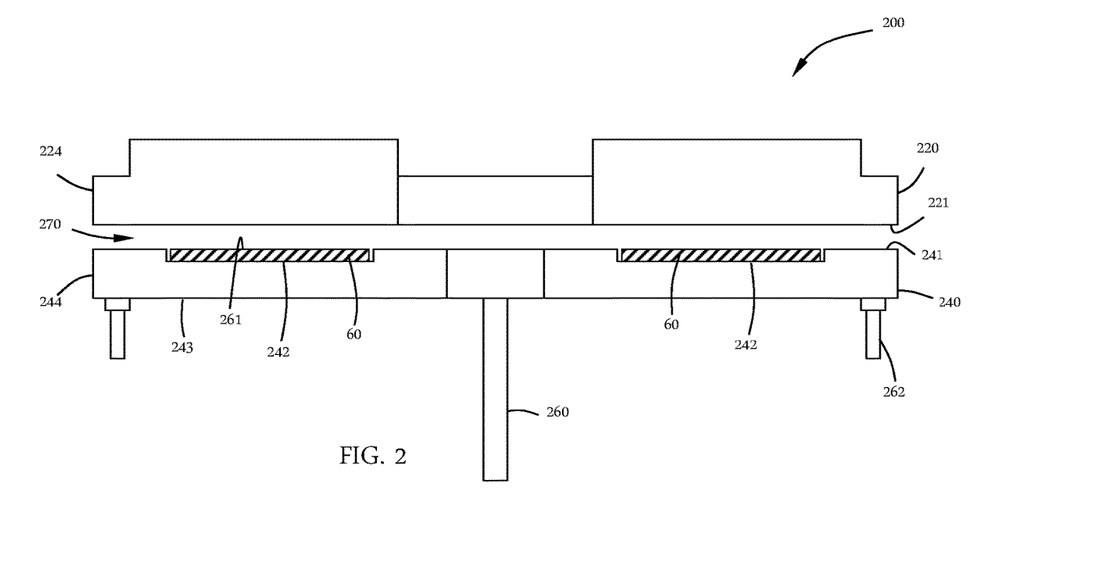
FIG. 2 shows a cross-sectional view of a batch processing chamber in accordance with one or more embodiment of the disclosure.

FIG. 2 shows a cross-section of a processing chamber 200 including a gas distribution assembly 220, also referred to as injectors or an injector assembly, and a susceptor assembly 240. The gas distribution assembly 220 is any type of gas delivery device used in a processing chamber. The gas distribution assembly 220 includes a front surface 221 which faces the susceptor assembly 240. The front surface 221 can have any number or variety of openings to deliver a flow of gases toward the susceptor assembly 240. The gas distribution assembly 220 also includes an outer edge 224 which in the embodiments shown, is substantially round.

The specific type of gas distribution assembly 220 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. In a binary reaction, the plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the process region through the purge gas P channel(s). A substrate moving from one end of the gas distribution assembly to the other end will be exposed to each of the process gases in turn, forming a layer on the substrate surface.

Figure 3:
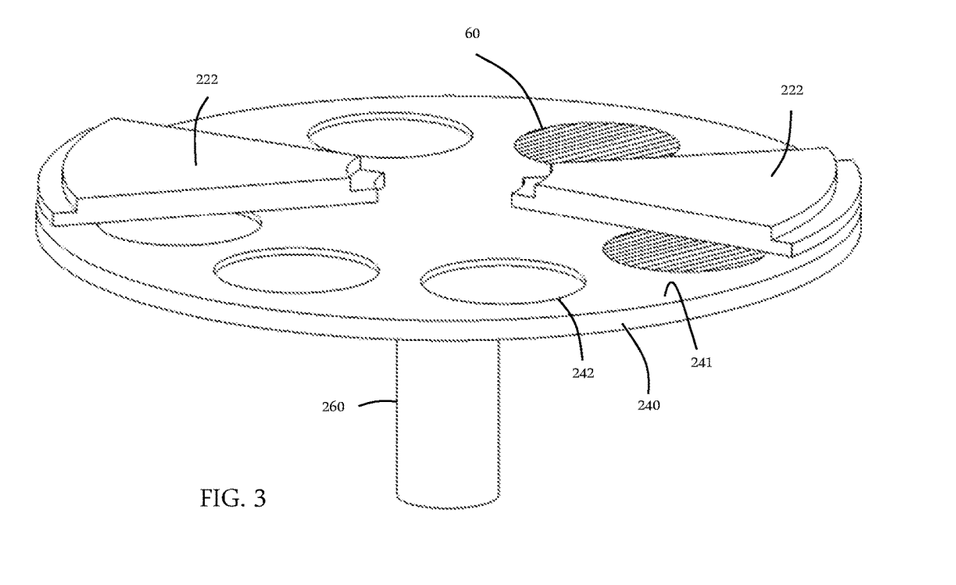
FIG. 3 shows a partial perspective view of a batch processing chamber in accordance with one or more embodiment of the disclosure.

In some embodiments, the gas distribution assembly 220 is a rigid stationary body made of a single injector unit. In one or more embodiments, the gas distribution assembly 220 is made up of a plurality of individual sectors (e.g., injector units 222), as shown in FIG. 3. Either a single piece body or a multi-sector body can be used with the various embodiments of the disclosure described.

A susceptor assembly 240 is positioned beneath the gas distribution assembly 220. The susceptor assembly 240 includes a top surface 241 and at least one recess 242 in the top surface 241. The susceptor assembly 240 also has a bottom surface 243 and an edge 244. The recess 242 can be any suitable shape and size depending on the shape and size of the substrates 60 being processed. In the embodiment shown in FIG. 2, the recess 242 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 2, the recess 242 in the top surface 241 of the susceptor assembly 240 is sized so that a substrate 60 supported in the recess 242 has a top surface 61 substantially coplanar with the top surface 241 of the susceptor 240. As used in this specification and the appended claims, the term "substantially coplanar" means that the top surface of the wafer and the top surface of the susceptor assembly are coplanar within ±0.2 mm. In some embodiments, the top surfaces are coplanar within 0.5 mm, ±0.4 mm, ±0.35 mm, ±0.30 mm, ±0.25 mm, ±0.20 mm, ±0.15 mm, ±0.10 mm or ±0.05 mm.

The susceptor assembly 240 of FIG. 2 includes a support post 260 which is capable of lifting, lowering and rotating the susceptor assembly 240. The susceptor assembly may include a heater, or gas lines, or electrical components within the center of the support post 260. The support post 260 may be the primary means of increasing or decreasing the gap between the susceptor assembly 240 and the gas distribution assembly 220, moving the susceptor assembly 240 into proper position. The susceptor assembly 240 may also include fine tuning actuators 262 which can make micro-adjustments to susceptor assembly 240 to create a predetermined gap 270 between the susceptor assembly 240 and the gas distribution assembly 220.

In some embodiments, the gap 270 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 200 shown in the Figures is a carousel-type chamber in which the susceptor assembly 240 can hold a plurality of substrates 60. As shown in FIG. 3, the gas distribution assembly 220 may include a plurality of separate injector units 222, each injector unit 222 being capable of depositing a film on the wafer, as the wafer is moved beneath the injector unit. Two pie-shaped injector units 222 are shown positioned on approximately opposite sides of and above the susceptor assembly 240. This number of injector units 222 is shown for illustrative purposes only. It will be understood that more or less injector units 222 can be included. In some embodiments, there are a sufficient number of pie-shaped injector units 222 to form a shape conforming to the shape of the susceptor assembly 240. In some embodiments, each of the individual pie-shaped injector units 222 may be independently moved, removed and/or replaced without affecting any of the other injector units 222. For example, one segment may be raised to permit a robot to access the region between the susceptor assembly 240 and gas distribution assembly 220 to load/unload substrates 60.

Figure 4:
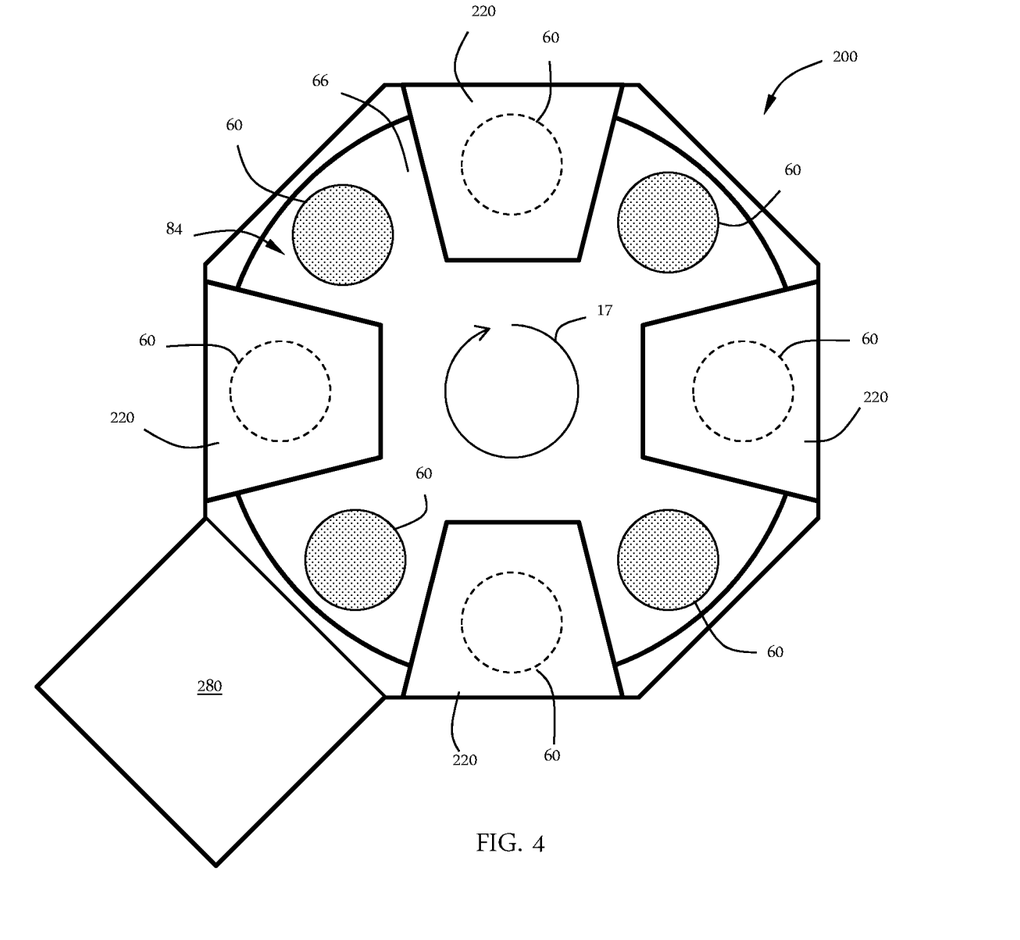
FIG. 4 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 4, the processing chamber 200 has four gas injector assemblies and four substrates 60. At the outset of processing, the substrates 60 can be positioned between the gas distribution assemblies 220. Rotating 17 the susceptor assembly 240 by 45° will result in each substrate 60 which is between gas distribution assemblies 220 to be moved to a gas distribution assembly 220 for film deposition, as illustrated by the dotted circle under the gas distribution assemblies 220. An additional 45° rotation would move the substrates 60 away from the gas distribution assemblies 220. The number of substrates 60 and gas distribution assemblies 220 can be the same or different. In some embodiments, there are the same numbers of wafers being processed as there are gas distribution assemblies. In one or more embodiments, the number of wafers being processed are fractions of or an integer multiple of the number of gas distribution assemblies. For example, if there are four gas distribution assemblies, there are 4× wafers being processed, where x is an integer value greater than or equal to one. In an exemplary embodiment, the gas distribution assembly 220 includes eight process regions separated by gas curtains and the susceptor assembly 240 can hold six wafers.

The processing chamber 200 shown in FIG. 4 is merely representative of one possible configuration and should not be taken as limiting the scope of the disclosure. Here, the processing chamber 200 includes a plurality of gas distribution assemblies 220. In the embodiment shown, there are four gas distribution assemblies 220 (also called injector assemblies) evenly spaced about the processing chamber 200. The processing chamber 200 shown is octagonal; however, those skilled in the art will understand that this is one possible shape and should not be taken as limiting the scope of the disclosure. The gas distribution assemblies 220 shown are trapezoidal, but can be a single circular component or made up of a plurality of pie-shaped segments, like that shown in FIG. 3.

The embodiment shown in FIG. 4 includes a load lock chamber 280, or an auxiliary chamber like a buffer station. This chamber 280 is connected to a side of the processing chamber 200 to allow, for example, the substrates (also referred to as substrates 60) to be loaded/unloaded from the chamber 200. A wafer robot may be positioned in the chamber 280 to move the substrate onto the susceptor.

Rotation of the carousel (e.g., the susceptor assembly 240) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 5:
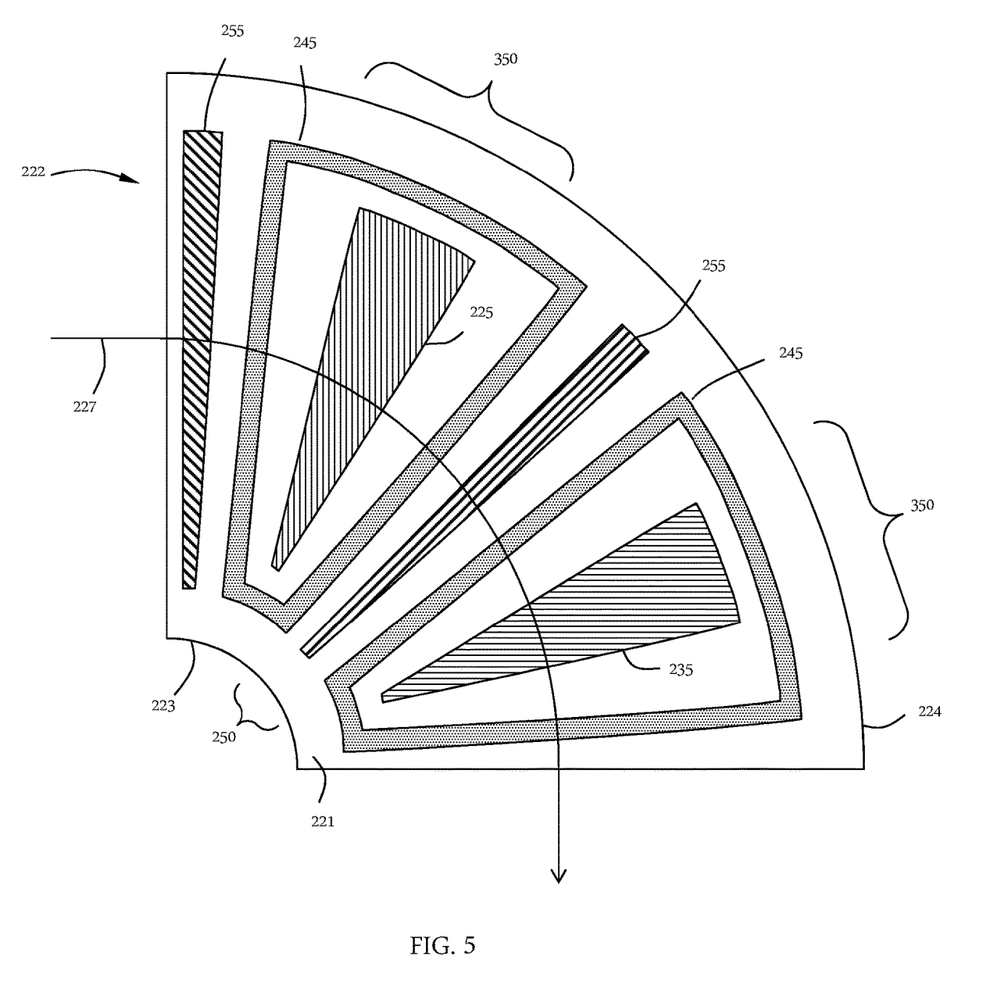
FIG. 5 shows a schematic view of a portion of a wedge shaped gas distribution assembly for use in a batch processing chamber in accordance with one or more embodiment of the disclosure.
Figure 6:
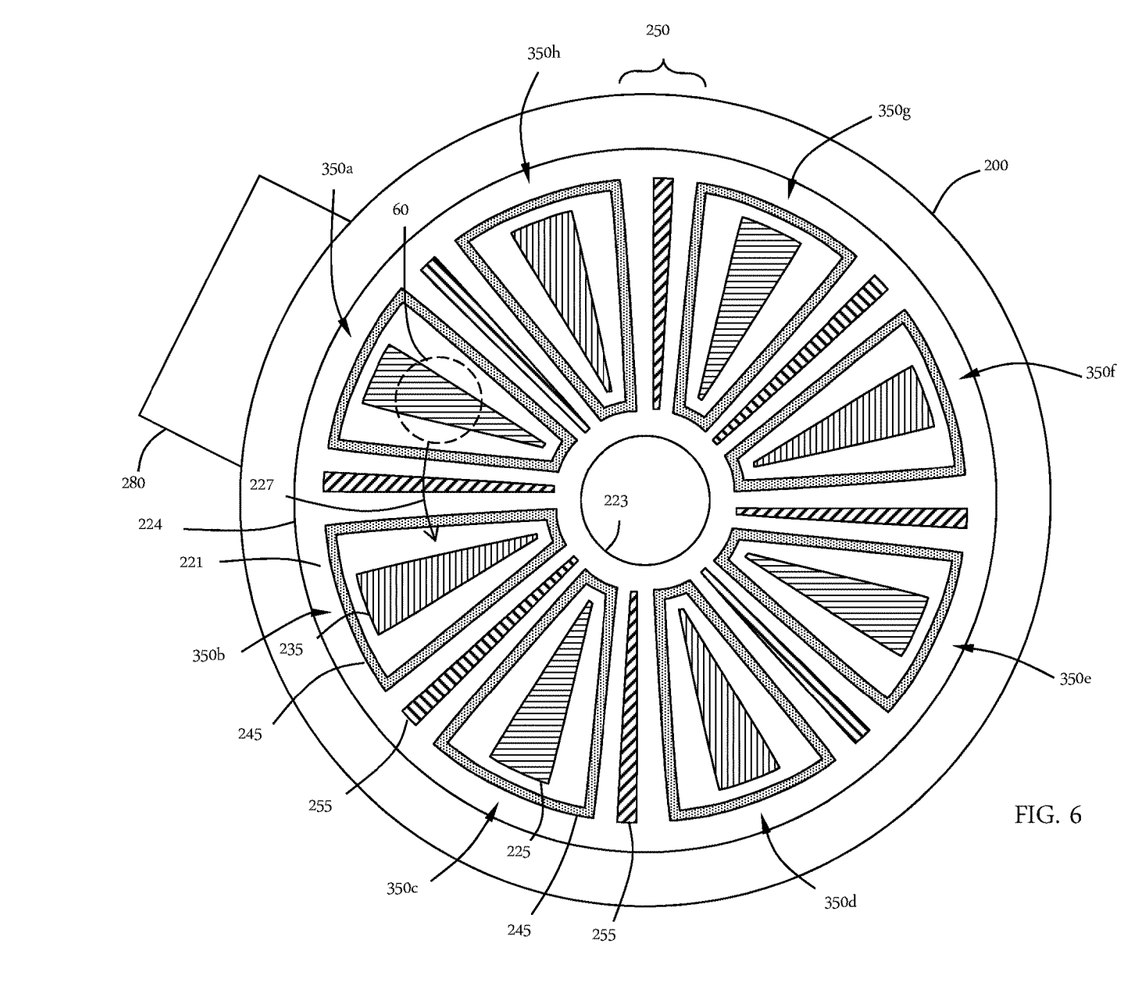
FIG. 6 shows a schematic view of a batch processing chamber in accordance with one or more embodiment of the disclosure.

FIG. 5 shows a sector or portion of a gas distribution assembly 222, which may be referred to as an injector unit. The injector units 222 can be used individually or in combination with other injector units. For example, as shown in FIG. 6, four of the injector units 222 of FIG. 5 are combined to form a single gas distribution assembly 220. (The lines separating the four injector units are not shown for clarity.) While the injector unit 222 of FIG. 5 has both a first reactive gas port 225 and a second gas port 235 in addition to purge gas ports 255 and vacuum ports 245, an injector unit 222 does not need all of these components.

Referring to both FIGS. 5 and 6, a gas distribution assembly 220 in accordance with one or more embodiments may comprise a plurality of sectors (or injector units 222) with each sector being identical or different. The gas distribution assembly 220 is positioned within the processing chamber and comprises a plurality of elongate gas ports 225, 235, 245 in a front surface 221 of the gas distribution assembly 220. The plurality of elongate gas ports 225, 235, 245, 255 extend from an area adjacent the inner peripheral edge 223 toward an area adjacent the outer peripheral edge 224 of the gas distribution assembly 220. The plurality of gas ports shown include a first reactive gas port 225, a second gas port 235, a vacuum port 245 which surrounds each of the first reactive gas ports and the second reactive gas ports and a purge gas port 255.

With reference to the embodiments shown in FIG. 5 or 6, when stating that the ports extend from at least about an inner peripheral region to at least about an outer peripheral region, however, the ports can extend more than just radially from inner to outer regions. The ports can extend tangentially as vacuum port 245 surrounds reactive gas port 225 and reactive gas port 235. In the embodiment shown in FIGS. 5 and 6, the wedge shaped reactive gas ports 225, 235 are surrounded on all edges, including adjacent the inner peripheral region and outer peripheral region, by a vacuum port 245.

Referring to FIG. 5, as a substrate moves along path 227, each portion of the substrate surface is exposed to the various reactive gases. To follow the path 227, the substrate will be exposed to, or "see", a purge gas port 255, a vacuum port 245, a first reactive gas port 225, a vacuum port 245, a purge gas port 255, a vacuum port 245, a second gas port 235 and a vacuum port 245. Thus, at the end of the path 227 shown in FIG. 5, the substrate has been exposed to the first reactive gas 225 and the second reactive gas 235 to form a layer. The injector unit 222 shown makes a quarter circle but could be larger or smaller. The gas distribution assembly 220 shown in FIG. 6 can be considered a combination of four of the injector units 222 of FIG. 3 connected in series.

The injector unit 222 of FIG. 5 shows a gas curtain 250 that separates the reactive gases. The term "gas curtain" is used to describe any combination of gas flows or vacuum that separate reactive gases from mixing. The gas curtain 250 shown in FIG. 5 comprises the portion of the vacuum port 245 next to the first reactive gas port 225, the purge gas port 255 in the middle and a portion of the vacuum port 245 next to the second gas port 235. This combination of gas flow and vacuum can be used to prevent or minimize gas phase reactions of the first reactive gas and the second reactive gas.

Referring to FIG. 6, the combination of gas flows and vacuum from the gas distribution assembly 220 form a separation into a plurality of process regions 350. The process regions are roughly defined around the individual gas ports 225, 235 with the gas curtain 250 between 350. The embodiment shown in FIG. 6 makes up eight separate process regions 350 with eight separate gas curtains 250 between. A processing chamber can have at least two process regions. In some embodiments, there are at least three, four, five, six, seven, eight, nine, 10, 11 or 12 process regions.

During processing a substrate may be exposed to more than one process region 350 at any given time. However, the portions that are exposed to the different process regions will have a gas curtain separating the two. For example, if the leading edge of a substrate enters a process region including the second gas port 235, a middle portion of the substrate will be under a gas curtain 250 and the trailing edge of the substrate will be in a process region including the first reactive gas port 225.

A factory interface 280 (as shown in FIG. 4), which can be, for example, a load lock chamber, is shown connected to the processing chamber 200. A substrate 60 is shown superimposed over the gas distribution assembly 220 to provide a frame of reference. The substrate 60 may often sit on a susceptor assembly to be held near the front surface 221 of the gas distribution plate 220. The substrate 60 is loaded via the factory interface 280 into the processing chamber 200 onto a substrate support or susceptor assembly (see FIG. 4). The substrate 60 can be shown positioned within a process region because the substrate is located adjacent the first reactive gas port 225 and between two gas curtains 250a, 250b. Rotating the substrate 60 along path 227 will move the substrate counter-clockwise around the processing chamber 200. Thus, the substrate 60 will be exposed to the first process region 350a through the eighth process region 350h, including all process regions between.

Some embodiments of the disclosure are directed to a processing chamber 200 with a plurality of process regions 350a-350h with each process region separated from an adjacent region by a gas curtain 250. For example, the processing chamber shown in FIG. 6. The number of gas curtains and process regions within the processing chamber can be any suitable number depending on the arrangement of gas flows. The embodiment shown in FIG. 6 has eight gas curtains 250 and eight process regions 350a-350h.

Referring back to FIG. 1, the processing platform 100 includes a treatment chamber 140 connected to a second side 112 of the central transfer station 110. The treatment chamber 140 of some embodiments is configured to expose the wafers to a process to treat the wafers before and/or after processing in first batch processing chamber 120. The treatment chamber 140 of some embodiments comprises an annealing chamber. The annealing chamber can be a furnace annealing chamber or a rapid thermal annealing chamber, or a different chamber configured to hold a wafer at a predetermined temperature and pressure and provide a flow of gas to the chamber.

In some embodiments, the processing platform further comprises a second batch processing chamber 130 connected to a third side 113 of the central transfer station 110. The second batch processing chamber 130 can be configured similarly to the batch processing chamber 120, or can be configured to perform a different process or to process different numbers of substrates.

The second batch processing chamber 130 can be the same as the first batch processing chamber 120 or different. In some embodiments, the first batch processing chamber 120 and the second batch processing chamber 130 are configured to perform the same process with the same number of wafers in the same batch time so that x (the number of wafers in the first batch processing chamber 120) and y (the number of wafers in the second batch processing chamber 130) are the same and the first batch time and second batch time (of the second batch processing chamber 130) are the same. In some embodiments, the first batch processing chamber 120 and the second batch processing chamber 130 are configured to have one or more of different numbers of wafers (x not equal to y), different batch times, or both.

In the embodiment shown in FIG. 1, the processing platform 100 includes a second treatment chamber 150 connected to a fourth side 114 of the central transfer station 110. The second treatment chamber 150 can be the same as the treatment chamber 140 or different.

As shown in FIG. 1, a controller 195 may be provided and coupled to various components of the processing platform 100 to control the operation thereof. The controller 195 can be a single controller that controls the entire processing platform 100 or a single processing chamber. In some embodiments, the controller 195 includes multiple sub-controllers that control individual portions of the processing platform 100. For example, a primary processing platform controller might be connected to and configured to communicate with one or more individual chamber controllers which control the operation of a particular processing chamber. In some embodiments, the controller 195 includes a central processing unit (CPU), support circuits, memory, and an input/output (I/O) system/device. The controller 195 may control the processing platform 100 directly, or via computers (or controllers) associated with particular process chamber and/or support system components. The controller 195 may be one of any form of general-purpose computer processor that can be used in an industrial setting for controlling various chambers and sub-processors. The memory or computer readable medium of the controller 195 may be one or more of readily available memory such as random access memory (RAM), read only memory (ROM), floppy disk, hard disk, optical storage media (e.g., compact disc or digital video disc), flash drive, or any other form of digital storage, local or remote. The support circuits are coupled to the CPU for supporting the processor in a conventional manner. These circuits include cache, power supplies, clock circuits, input/output circuitry and subsystems, and the like. One or more processes may be stored in the memory as software routine that may be executed or invoked to control the operation of the processing platform 100 or individual processing chambers in the manner described herein. The software routine may also be stored and/or executed by a second CPU (not shown) that is remotely located from the hardware being controlled by the CPU. The input/output can include keyboards, computer mice, displays and/or printers. The software routine, when executed by the processor causes the controller 195 to function as a specific purpose controller. When the controller 195 includes a computer, the controller 195 functions as a special purpose computer for controlling the processing platform 100.

In some embodiments, the processing platform 100 can include a controller 195 connected to the robot 117 (the connection is not shown). The controller 195 can be configured to move wafers between the pre-clean chamber 140 and the first batch processing chamber 120 with a first arm 118 of the robot 117. In some embodiments, the controller 195 is also configured to move wafers between the second single wafer processing chamber 150 and the second batch processing chamber 130 with a second arm 119 of the robot 117.

In some embodiments, the controller 195 is connected to the susceptor assembly 240 and the gas distribution assembly 220 of a processing chamber 200. The controller 195 can be configured to rotate 17 the susceptor assembly 240 about a central axis. The controller can also be configured to control the gas flows in the gas ports 225, 235, 245, 255. In some embodiments, the first reactive gas port 225 provides a flow of a first deposition gas. In some embodiments, the second reactive gas port 235 provides a flow of a second deposition gas. In some embodiments, other gas ports (not labelled) may provide a flow of a modifying compound. The first reactive gas port 225, the second reactive gas port 235 and the other reactive gas ports (not labelled) may be arranged in any processing order.

The processing platform 100 can also include a first buffer station 151 connected to a fifth side 115 of the central transfer station 110 and/or a second buffer station 152 connected to a sixth side 116 of the central transfer station 110. The first buffer station 151 and second buffer station 152 can perform the same or different functions. For example, the buffer stations may hold a cassette of wafers which are processed and returned to the original cassette, or the first buffer station 151 may hold unprocessed wafers which are moved to the second buffer station 152 after processing. In some embodiments, one or more of the buffer stations are configured to pre-treat, pre-heat or clean the wafers before and/or after processing.

In some embodiments, the controller 195 is configured to move wafers between the first buffer station 151 and one or more of the treatment chamber 140 and the first batch processing chamber 120 using the first arm 118 of the robot 117. In some embodiments, the controller 195 is configured to move wafers between the second buffer station 152 and one or more of the second treatment chamber 150 or the second batch processing chamber 130 using the second arm 119 of the robot 117.

The processing platform 100 may also include one or more slit valves 160 between the central transfer station 110 and any of the processing chambers. In the embodiment shown, there is a slit valve 160 between each of the processing chambers 120, 130, 140, 150 and the central transfer station 110. The slit valves 160 can open and close to isolate the environment within the processing chamber from the environment within the central transfer station 110. For example, if the processing chamber will generate plasma during processing, it may be helpful to close the slit valve for that processing chamber to prevent stray plasma from damaging the robot in the transfer station.

In some embodiments, the processing chambers are not readily removable from the central transfer station 110. To allow maintenance to be performed on any of the processing chambers, each of the processing chambers may further include a plurality of access doors 170 on sides of the processing chambers. The access doors 170 allow manual access to the processing chamber without removing the processing chamber from the central transfer station 110. In the embodiment shown, each side of each of the processing chamber, except the side connected to the transfer station, have an access door 170. The inclusion of so many access doors 170 can complicate the construction of the processing chambers employed because the hardware within the chambers would need to be configured to be accessible through the doors.

The processing platform of some embodiments includes a water box 180 connected to the transfer chamber 110. The water box 180 can be configured to provide a coolant to any or all of the processing chambers. Although referred to as a "water" box, those skilled in the art will understand that any coolant can be used.

In some embodiments, the size of the processing platform 100 allows for the connection to house power through a single power connector 190. The single power connector 190 attaches to the processing platform 100 to provide power to each of the processing chambers and the central transfer station 110.

The processing platform 100 can be connected to a factory interface 102 to allow wafers or cassettes of wafers to be loaded into the platform 100. A robot 103 within the factory interface 102 can be moved the wafers or cassettes into and out of the buffer stations 151, 152. The wafers or cassettes can be moved within the platform 100 by the robot 117 in the central transfer station 110. In some embodiments, the factory interface 102 is a transfer station of another cluster tool.

In some embodiments, the processing platform 100 or batch processing chamber 120 is connected to a controller. The controller can be the same controller 195 or a different controller. The controller can be coupled to the susceptor assembly and the gas distribution assembly of the batch processing chamber 120 and has one or more configurations. In some embodiments, the processing chamber is a single wafer or time-domain processing chamber and the controller can be coupled to the substrate support and the gas distribution system. The configurations can include, but are not limited to, a first configuration to rotate the susceptor assembly about the central axis, a second configuration to provide a flow of a first deposition gas to a process region, a third configuration to provide a flow of a second deposition gas to a process region, a fourth configuration to provide a flow of a modifying compound to one or more of the process regions, a fifth configuration to control the flow of reactive gases and purge gases using the gas distribution system, or a sixth configuration to control a temperature of the substrate.

The substrate may be any substrate capable of having material deposited thereon, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a solar array, solar panel, a light emitting diode (LED) substrate, a semiconductor wafer, or the like. In some embodiments, one or more additional layers may be disposed on the substrate such that the molecular layer may be at least partially formed thereon. For example, in some embodiments, a layer comprising a metal, a nitride, an oxide, or the like, or combinations thereof may be disposed on the substrate and may have the molecular layer formed upon such layer or layers.

A "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds, for example, the process gases described below.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

The period of time that the substrate is exposed to the deposition gas may be any suitable amount of time necessary to allow the metal precursor to form an adequate nucleation layer atop the substrate surfaces. For example, the process gas may be flowed into the process chamber for a period of about 0.1 seconds to about 90 seconds. In some time-domain ALD processes, the metal-containing gas is exposed the substrate surface for a time in the range of about 0.1 sec to about 90 sec, or in the range of about 0.5 sec to about 60 sec, or in the range of about 1 sec to about 30 sec, or in the range of about 2 sec to about 25 sec, or in the range of about 3 sec to about 20 sec, or in the range of about 4 sec to about 15 sec, or in the range of about 5 sec to about 10 sec.

In some embodiments, an inert gas may additionally be provided to the process chamber at the same time as the deposition gas. The inert gas may be mixed with the metal-containing gas (e.g., as a diluent gas) or separately and can be pulsed or of a constant flow. In some embodiments, the inert gas is flowed into the processing chamber at a constant flow in the range of about 1 to about 10000 sccm. The inert gas may be any inert gas, for example, such as argon, helium, neon, combinations thereof, or the like. In one or more embodiments, the metal-containing gas is mixed with argon prior to flowing into the process chamber.

The flow of inert gas may facilitate removing any excess first deposition gas components and/or excess reaction byproducts from the process chamber to prevent unwanted gas phase reactions of the first and second deposition gases. For example, the flow of inert gas may remove excess first deposition gas from the process chamber, preventing a reaction between the first deposition gas and a subsequent deposition gas.

In addition to the foregoing, additional process parameters may be regulated while exposing the substrate to the metal-containing process gas. For example, in some embodiments, the process chamber may be maintained at a certain pressure or at a certain temperature to facilitate the deposition of the molecular layer.

While the generic embodiment of the processing method described in this disclosure includes only two pulses of reactive gases, it will be understood that this is merely exemplary and that additional pulses of reactive gases may be used. The pulses can be repeated in their entirety or in part. For example all three pulses could be repeated or only two can be repeated. This can be varied for each cycle.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of depositing a film comprising:
   providing a substrate comprising a first material having a hydrogen terminated surface and a second material having a hydroxyl terminated surface;
   exposing the substrate to a modifying compound comprising a modifying species that reacts with the hydroxyl terminated surface of the second material to form a modified second surface on the second material; and
   exposing the substrate to one or more deposition gases which react with the modified second surface of the second material to form a film on the second material,
   wherein the modifying species has a general formula $(RO)_3Si-L-Si(OR)_3$ where each R is independently selected from C1-C4 alkyl groups and L is an aromatic moiety or a carbon chain comprising 1 to 3 carbon atoms.

2. The method of claim 1, wherein the first material comprises silicon and the second material comprises silicon oxide.

3. The method of claim 1, wherein R consists essentially of methyl.

4. The method of claim 1, wherein L is a phenyl group.

5. The method of claim 4, wherein the phenyl group has the silicon atoms in a para position.

6. The method of claim 1, wherein L is $-(CH_2)_2-$.

7. The method of claim 1, wherein L contains at least one double bond.

8. The method of claim 7, wherein L is $-CH=CH-$.

* * * * *